United States Patent [19]

Seo

[11] Patent Number: 5,027,324
[45] Date of Patent: Jun. 25, 1991

[54] SENSE AMPLIFIER DRIVER FOR USE IN MEMORY DEVICE

[75] Inventor: Seungmo Seo, Seoul, Rep. of Korea

[73] Assignee: Samsung Electronics Co., Ltd., Rep. of Korea

[21] Appl. No.: 485,913

[22] Filed: Feb. 27, 1990

[30] Foreign Application Priority Data

Jun. 10, 1989 [KR] Rep. of Korea ............. 89-8066

[51] Int. Cl.[5] ............. G11C 7/00; G11C 11/40; G11C 11/413
[52] U.S. Cl. ................. 365/205; 365/189.06; 365/230.06; 365/194
[58] Field of Search ............. 365/189.01, 189.11, 365/189.06, 189.08, 205, 207, 208, 233, 230.06, 196, 194; 307/530

[56] References Cited

U.S. PATENT DOCUMENTS 4,851,720 7/1989 Pathak et al. ............. 365/208 X
4,951,256 8/1990 Tobita ............. 365/208

Primary Examiner—Alyssa H. Bowler
Attorney, Agent, or Firm—Lowe, Price, LeBlanc and Becker

[57] ABSTRACT

A sense amplifier driver for memory device includes: a first inverter for inverting sensing clocks; a second inverter for reinverting the outputs of the first inverter; time delaying resistances disposed between the gates of the second inverter in parallel with the output terminals of the second inverter so that they can be turned on successively at different times in response to the outputs of the second inverter; a third inverter consisting of n-channel MOS transistors having drains commonly connected to the low potential terminal of the sense amplifier; and pull-down device for pulling down to the ground potential the gate voltage of at least an n-channel MOS transistor disposed within the third inverter. According to the present invention, the peak current can be reduced, and the operating power can be kept to the minimum.

2 Claims, 5 Drawing Sheets

SENSE AMPLIFIER DRIVER FOR USE IN MEMORY DEVICE

FIELD OF THE INVENTION

The present invention relates to sense amplifier circuitry for sensing data in a memory cell, and particularly to a sense amplifier driver in which the dynamic dissipation due to transient current is reduced by removing the current path from the sensing clock driver and the restore clock driver during return to a precharge state. The sense amplifier driver is capable of driving the memory cell by means of restore clocks and sensing clocks having multiple slopes for reducing the peak current during the process of restoring the data to the memory cell or during the process of sensing the data from the memory cell of a CMOS DRAM.

BACKGROUND OF THE INVENTION

Generally, sense amplifier circuitry for sensing data stored in a CMOS DRAM cell includes a sensing clock driver, a restore clock driver, a delay section, and a sense amplifier.

Both the sensing clock signal for sensing data from the memory cell and the restore clock signal for restoring the memory cell data increase the peak current if they have steep slopes when being switched from a high level to a low level or from a low level to a high level. This increased peak current will create noise, causing the sense amplifier circuitry to produce errors.

The conventional solution for such drawbacks is to modify the steeply varying slope into a two-step or multistep slope during the switching process of the sensing clock and the restore clock, resulting in a clock signal having a gentle slope.

The conventional circuitry of the sense amplifier driver is illustrated in FIG. 1, which shows the characteristics described above.

However, in spite of the merits described above, this conventional sense amplifier circuitry has shortcomings as described below.

When the precharge operation is initiated for the sense amplifier after completing the sensing and restoring operations, the MOS transistors within the sensing clock driver are simultaneously turned on within a short period of time, due to the delaying effect of the trailing edges of the restore clock signal and the sensing clock signal. The delaying effect is caused by the multislope characteristics of the sensing clock and the restore clock signals. The simultaneous activation of these MOS transistors will dissipate the DC current through a DC current path. The MOS transistors within the restore clock driver will also form DC current paths together with those in the sense amplifier driver, whereby the DC current is dissipated. This will cause the problem of substantial dynamic power loss throughout the entire high density memory device.

SUMMARY OF THE INVENTION

The present invention is intended to overcome the above-described disadvantage of the conventional technique.

Therefore, it is the object of the present invention to provide a sense amplifier driver able to prevent the dissipation of the DC power by removing the DC current paths of the sensing clock driver after completing the sensing operation.

In achieving the above object, the sense amplifier driver according to the present invention includes:
a first inverter for inverting a sensing clock;
a second inverter for re-inverting the outputs of the first inverter; and
and a third inverter including time delaying resistances disposed between the gates of transistors, being in parallel with the terminals of the second inverter in such a manner that the transistors are turned on successively at different times in response to the outputs of the second inverter.

The sense amplifier driver also includes n-channel MOS transistors as sensing transistors having drains connected in common to the low potential terminal of the sense amplifier.

The sense amplifier driver operates in such manner that the sensing enable signal outputted from the output node of the sensing transistor has a multistep slope.

Accordingly it is required that the n-channel transistors are arranged in parallel with a pull-down transistor of the second inverter so that the gate voltages of the plurality of the sensing transistors disposed in parallel are reduced as soon as the sensing clock is disabled.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE INVENTION

Figure 1:
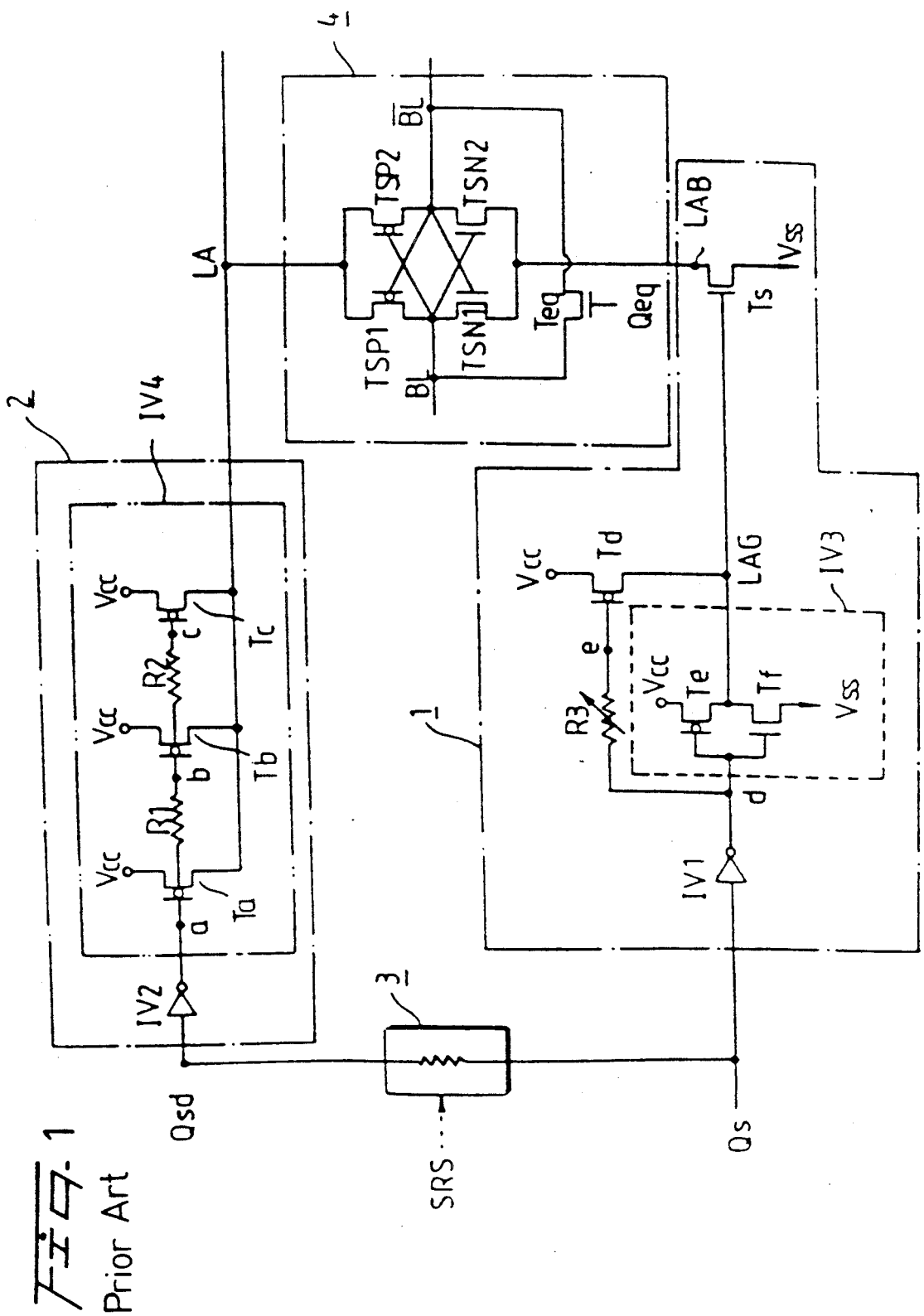
FIG. 1 is a detailed circuit diagram of a conventional sense amplifier driver.
Figure 4:
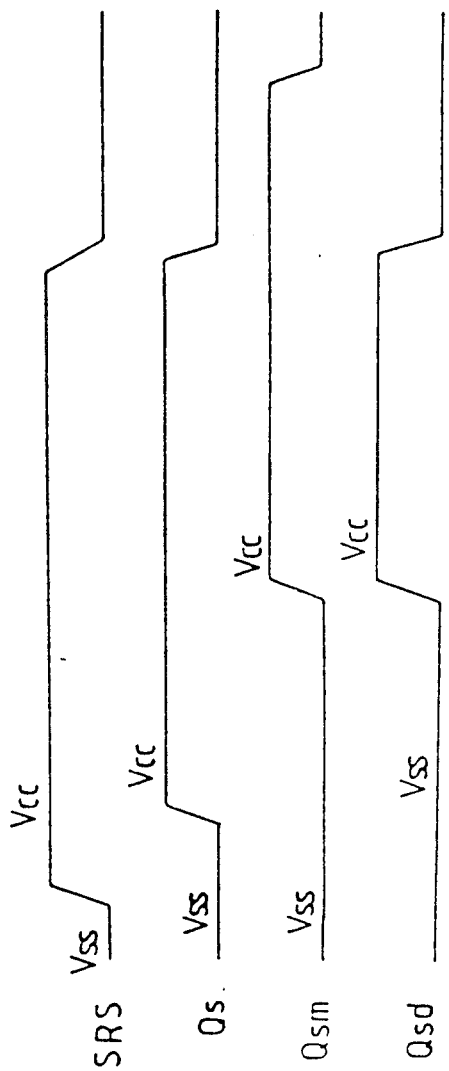
FIG. 4 includes a series of timing charts of the operations of the circuit of FIG. 3.

To give a better understanding of the present invention, the driver circuitry for a conventional cross-coupled sense amplifier is described referring to FIGS. 1 and 4.

As shown in FIG. 1, sense amplifier circuitry for sensing data of a memory cell includes a sensing clock driver 1, a restore clock driver 2, a delaying means 3 and a sense amplifier 4.

In such a sense amplifier driver, the sensing clock driver 1 is arranged so that an NMOS sense transistor Ts is controlled by means of a sensing clock signal Qs passing through a first inverter and a second inverter circuit IV3 consisting of PMOS, NMOS transistors Te, Tf. The sensing clock driver 1 is further arranged so that the NMOS sensing transistor Ts is also controlled by means of the output of a PMOS transistor Td driven by the sensing clock signal Qs passing through the first inverter IV1 and a delaying resistance R3.

The restore clock driver 2 is arranged with delaying resistances R1 to R2 installed between the gates of the PMOS transistors Ta-To so that restore clock signal Qsd, outputted from the delaying section 3 in response to the sensing clock signal Qs successively turns on a plurality of the PMOS transistors Ta-Tc arranged in parallel within inverter IV4 via inverter IV2.

The sense amplifier 4 includes cross-coupled PMOS transistors TSP1, TSP2 and NMOS transistors TSN1, TSN2. The data restore and sensing operations are carried out by means of the output signals LAB of the sensing clock driver 1 supplied to the low potential node of the sense amplifier, and by means of the output signals LA of the restore clock driver 2 supplied to the high potential node of the sense amplifier.

Figure 2:
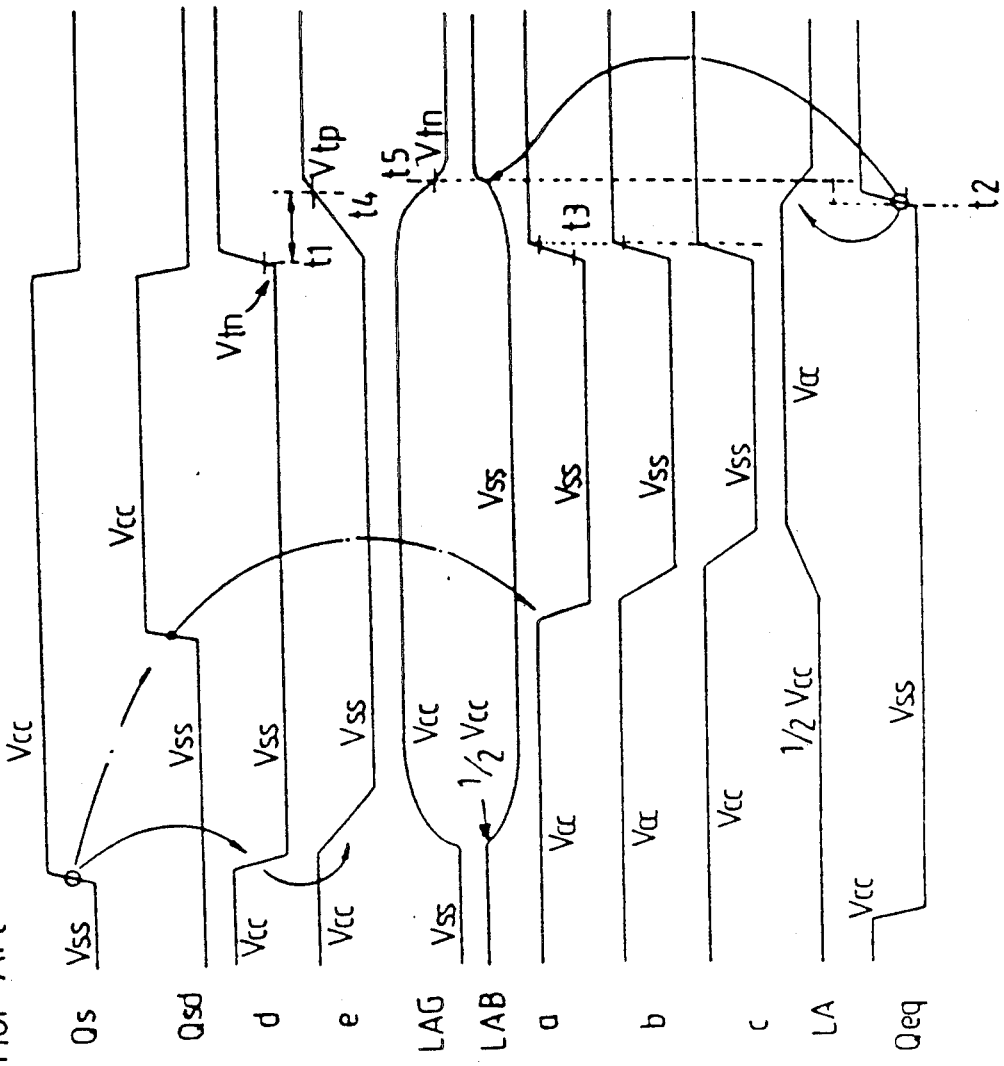
FIG. 2 includes a series of timing charts of the operations of the inputs and outputs of the critical portions of the circuitry of FIG. 1.

The operation of the conventional sense amplifier driver described above is set out with reference to the FIG. 2 timing charts. If the equalization control clock signal Qeq has a value of Vss, and the sensing clock signal Qs has a value of Vcc to initiate a sensing enable state, then the node d of the sensing clock driver 1 is shifted to a low level, causing the PMOS transistor Te to be turned on. The transistor Te has a relatively small current driving capability that cannot turn on the NMOS sense transistor Ts sufficiently. Accordingly, the NMOS transistor Ts does not immediately respond to the signal from the node d, having a relatively steep slope, but is slowly turned on.

After a certain period of time delay caused by resistance R3, the potential of the node e reaches a value of Vss, and the PMOS transistor Td having a larger current driving capability larger than that of transistor Te will be turned on. As a result, the potential of the node LAG gradually reaches a value of Vcc to completely turn on the NMOS sense transistor Ts, and as a result the sensing signal LAB gradually reaches the value of Vss to sense the data.

Meanwhile, the sensing clock signal Qs passes through the delaying section 3 to form a restore clock signal Qsd which is to be supplied to the restore clock driver 2. The process of forming the restore clock signal Qsd of the delaying section 3 is described in detail referring to FIGS. 3 and 4.

The sensing clock signal Qs is supplied through a delaying resistance Ro to one of the input terminals of a NAND gate G1. A condenser G is connected between ground line Vss and one of the input terminals of the NAND gate G1. A sensing/restore strobe signal SRS is supplied to the other input terminal of the NAND gate G1. An inverter G2 inverts the output of the NAND date G1 to generate a restore clock signal Qsd.

The sensing/restore strobe signal is maintained at a value of Vcc when the sensing and restoring operations are being carried out. When the sensing clock signal Qs is elevated from a value of Vss to a value of Vcc in order to enable the sense transistor Ts, the potential of one of the input terminals Qsm of the NAND gate G1 rises from Vss to after a certain period of time Vcc due to delaying resistance Ro and condenser C. At the same time, the potential of the output terminal of the invertor G2 also rises from Vss to Vcc to initiate a restore enable operation with restore clock signal Qsd.

Disabling of the sensing operation is synchronized with the disabling of the sensing/restore strobe signal in such a manner that, when the falling edge of the sensing clock signal Qs appears, the potential of one of the input terminals of the NAND gate G1, i.e., the potential of one of the terminals Qsm of the condenser C is lowered from Vcc to Vss after a certain period of time due to the delaying characteristics of the delaying resistance Ro.

As described above, however, due to the fact that a descending sensing/restore strobe signal SRS is supplied to one of the input terminals of the NAND gate G1, the output Qsd of the inverter G2 is lowered from Vcc to Vss in synchronization with the falling edge of the sensing/restore strobe signal SRS. Thus, the low potential disabled state of the restore clock signal Qsd occurs almost simultaneously with the low potential disabled state of the sensing clock signal Qs.

The restore clock signal Qsd is enabled after a certain period of time from the time when the sensing clock Qs is enabled. The PMOS transistor Ta is turned on, and after a certain time period delay caused by the resistance R1, the PMOS transistor Tb is turned on. Then the PMOS transistor Tc is turned on after another time period delay caused by the resistance R2. As a result, the potential of the restore signal La of the restore clock driver 2 supplied to the high potential node of the sense amplifier 4 is elevated from one half of the value of Vcc to a value of Vcc to restore the data to the sense amplifier 4.

However, in such conventional circuitry, when a sensing clock signal Qs is disabled, a DC current path is formed between the power line and the ground line through PMOS transistor Td of the sensing clock driver 1 which is delayed before being turned off. That is, a DC current path is formed through the PMOS, NMOS transistors Td, Tf between the power line and the ground line during the period from the time t1 when potential of the node d of the sensing clock driver 1 is elevated to reach the turn-on threshold voltage Vtn of NMOS transistor Tf, to the time t4 when the potential of the node e of the sensing clock driver 1 is elevated to reach the turn-off threshold voltage Vtp of the PMOS transistor Td.

Furthermore, during the period from the time t2 when the equalization control clock is elevated to Vcc, to the time t3 when the sense transistor Ts is turned off, a current path is formed through the following: PMOS transistor TSP1—equalization transistor Teq1—NMOS transistor TSN2—NMOS sense transistor Ts; or through PMOS transistor TSP2—equalization transistor Teq—NMOS transistor TSN1—NMOS sense transistor Ts. Thus, when the sensing clock signal Qs and the restore clock signal Qsd are disabled, the peak current is increased for a certain period of time, and an unnecessary loss of power is caused.

Figure 5:
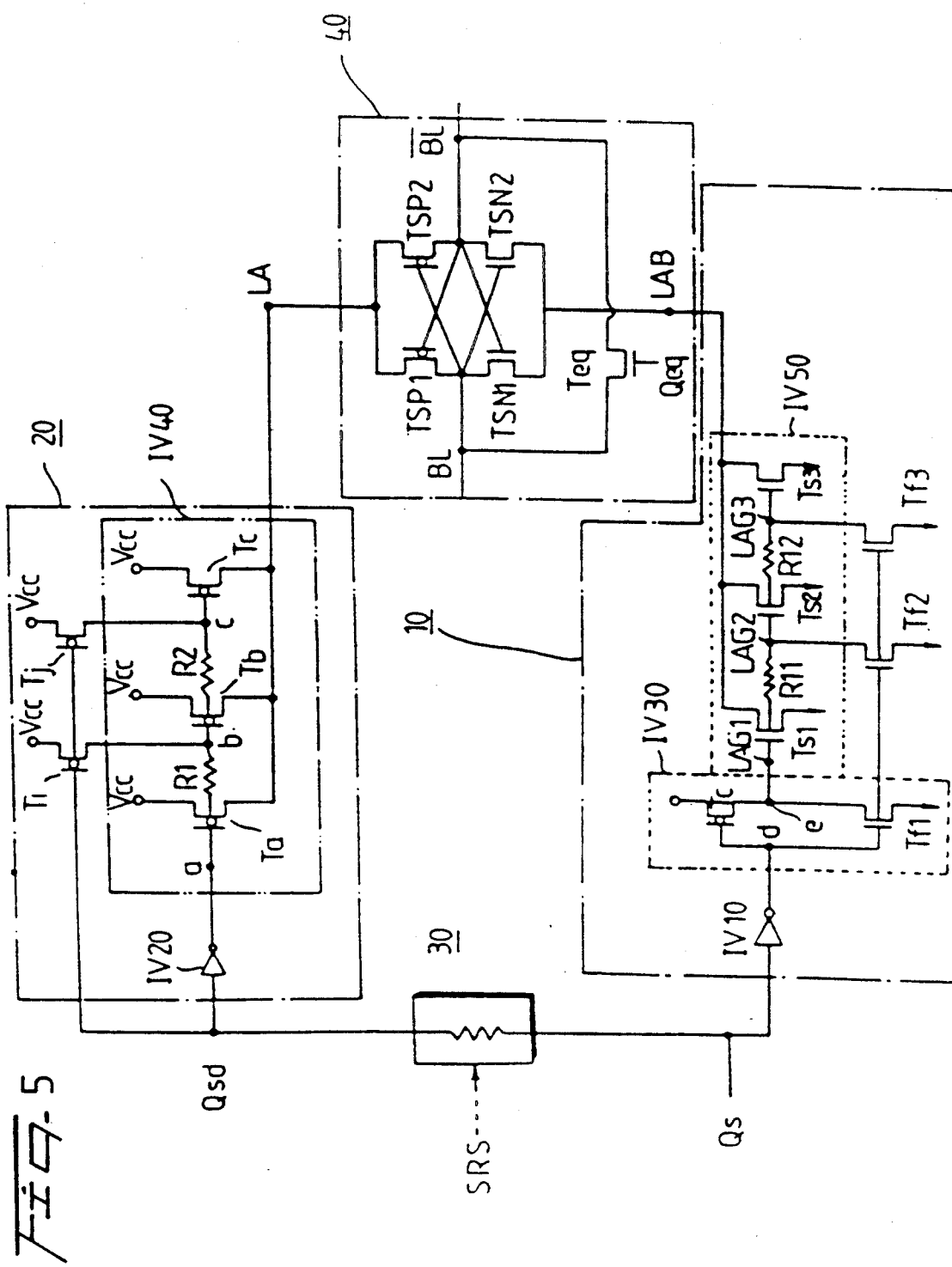
FIG. 5 is a detailed circuit diagram of the sense amplifier driver according to the present invention.
Figure 6:
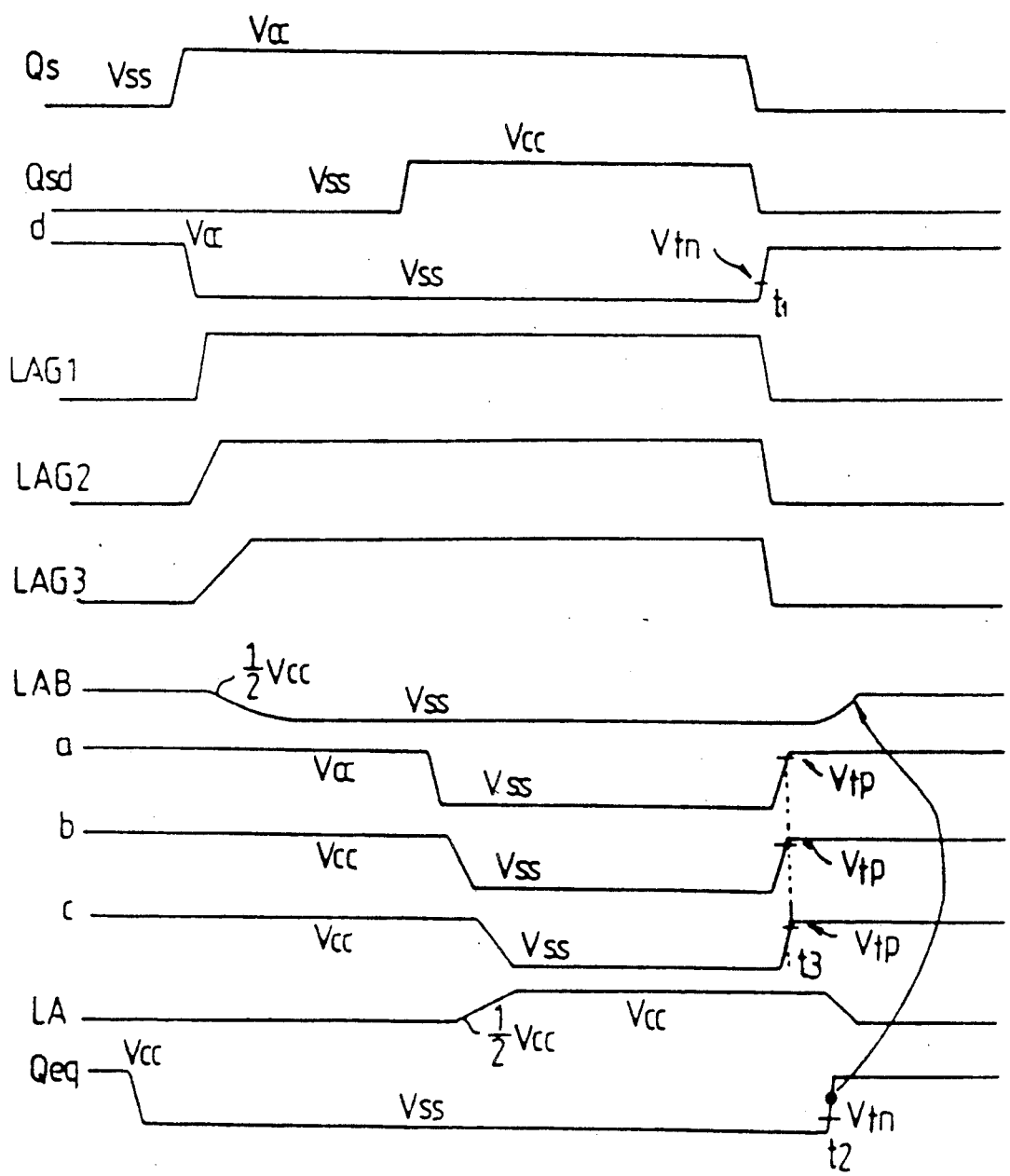
FIG. 6 includes a series of timing charts showing the input and output operations of the critical portions of the circuit of FIG. 5.

FIGS. 5 and 6 are respectively a circuit diagram of sense amplifier driver circuitry according to the present invention capable of providing a solution to the above-described problem, and a series timing chart for the operation thereof.

As shown in FIG. 5, the sensing clock driver 10 according to the present invention includes: a first inverter IV10 for inverting the sensing clock signal Qs; a second inverter IV30 for inverting the outputs of the first inverter IV10; a third inverter IV50 having a plurality of delaying means which are successively turned on at different times in response to the outputs of the second inverter IV30; and pull-down n-channel MOS transistors Tf1, Tf2, Tf3 which are disposed between the gates of NMOS transistors TS2, TS3 which in turn have delaying characteristics within the third inverter IV50.

The second inverter IV30 consists of an n-channel MOS transistor Tf1 and an n-channel NOS transistor Tc, and the output terminal of the n-channel MOS transistor Tc is connected to the third inverter IV50, while the third inverter IV50 sequentially connects the n-channel MOS transistors Ts1, Ts2, Ts3.

Resistances R11, R12 are installed between the gates of MOS transistors Ts1, Ts2, Ts3 in order to provide time delay characteristics.

Furthermore, the pull-down n-channel MOS transistors Tf2, Tf3 are arranged so that their gates are commonly connected to the gate of the n-channel MOS transistor Tf1 of the second inverter IV30, while their drains are connected to the terminals LAG2, LAG3 of the third inverter IV50.

Figure 3:
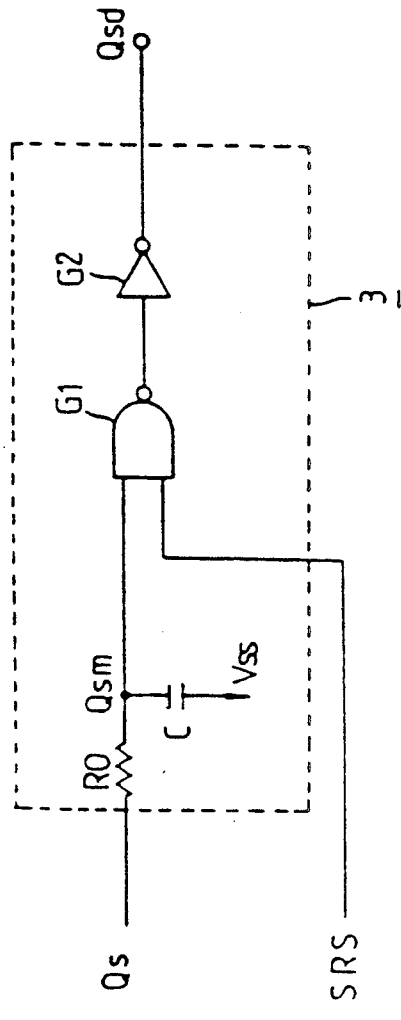
FIG. 3 is a detailed circuit diagram of the delaying section of the sensing clock-driver of FIG. 1.

The restore clock driver 20 is arranged such that the restore clock signal Qsd outputted from the delaying means 30 having the same arrangement as the delaying means 3 of FIG. 3 should be supplied through the inverter IV20 to the gates of a plurality of p-channel MOS transistors Ta-Tc of the inverter IV40, while resistances R1, R2 are installed between their gates so that the p-channel MOS transistors Ta-Tc should be successively delayed. The restore clock signal Qsd outputted from the delaying means 30 is supplied to the gates of p-channel MOS pull-up transistors Ti, Tj. When inputting a restore clock signal having a value of Vss, a signal with a value of Vcc which has gone through the respective p-channel MOS transistors Ti, Tj is supplied to the gates of the p-channel MOS transistors, Tb, Tc.

In order to prevent the formation of a DC current path during the disabling of the restore clock signal Qsd, the above mentioned p-channel MOS pull-up transistors Ti, Tj are used to pull up the voltages of the gates of the p-channel MOS transistors Tb,Tc having the delaying characteristics within the inverter IV40.

The sensing and restore clock signals LAB, LA outputted from the drain of the n-channel MOS sense transistor Ts3 and the drains of the p-channel MOS transistors Ta-Tc respectively, are supplied to the common source (low potential node) of the two n-channel MOS transistors TSN1, TSN2 of the four cross coupled transistors, and supplied to the common source (high potential node) of another two p-channel MOS transistors TSP1, TSP2, respectively so that sensing and restore operations for the cell data should be carried out.

The operation of the circuitry of the present invention is described in reference to the timing charts of FIG. 6.

If an equalization control clock signal Qeq having a value of Vss and a sensing clock signal Qs also having a value of Vss are supplied to the sensing clock driver 10, then a low level signal will be supplied to the second inverter IV30, after being inverted by the first inverter IV10. IV30 will turn on the p-channel MOS transistor Tc, with the result that a high level signal is supplied to the node e. This high level signal will be supplied to the third inverter IV50, and successively turn on the n-channel MOS transistors Ts1, Ts2, Ts3 with appropriate time delays due to the resistances R11, R12.

As shown in FIG. 6, the nodes LAG1, LAG2, LAG3 of the third inverter IV50 will produce successively delayed outputs, so that the output signal LAB supplied to the sense amplifier 40 should have a multistep slope at one half the value of Vcc before falling to a value of Vss. The pull-down n-channel MOS transistors Tf2, Tf3 are in an inactive state and therefore they will not affect the sensing operations.

The restore clock signal Qsd will pass through the inverter IV20 to successively turn on the plurality of the p-channel MOS restore transistors Ta-To, and accordingly the sensed data is restored by means of Vcc restore signal LA having a value of Vcc. The pull-up p-channel MOS transistors Ti, Tj are in an inactive state and therefore they can not affect the restoring operation.

When the sensing clock signal Qs is disabled, the sensing clock signal Qs is shifted to a low level, and a high level signal which has been inverted by the first inverter IV10 will be supplied through the node d to the second inverter IV30. This high level signal will keep the p-channel MOS transistor Tc in a blocked state, and will turn on the n-channel MOS transistor Tf1.

Accordingly, the n-channel MOS transistors Ts1, Ts2, Ts3 of the third inverter IV50 which is connected to the second inverter IV30 will be kept in a blocked state, but the residual current due to the delay by the resistances R11, R12 and the leakage current of the MOS transistors will create a circuit through the MOS n-channel transistor Tf1, thereby forming a DC current path to dissipate a loss of power.

According to the present invention, at the instant when the n-channel MOS transistor Tf1 of the second inverter IV30 is turned on, the pull-down n-channel MOS transistors Tf2, Tf3 connected to the gate of the transistor Tf1 are also turned on. As a result, the residual current remaining in the third inverter IV50 will flow through the nodes LAG2, LAG3 to the n-channel MOS transistors Tf2, Tf3, thereby preventing the formation of a DC current path which can cause a loss of power.

The low level segment of the restore clock Qsd turns off a series of the p-channel MOS transistors Ta-Tc within the inverter IV40 after passing through the inverter IV20. Then, the low level restore clock signal Qsd turns on the pull-up transistors Ti, Tj immediately without having a time delay. Accordingly, the gates of the p-channel MOS transistors Ta, Tb, Te are pulled up to a value of Vcc, and therefore, the p-channel MOS transistors Ta, Tb, Tc are all immediately turned off without having a time delay at the time t3. As a result, by the time the equalization clock signal Qeq is enabled, the path from the power source line will no longer exist.

Consequently, the formation of a DC current path through the p-channel MOS transistor Tc, the sense amplifier 40, and the n-channel MOS transistor Ts3 between the power line and the ground line is inhibited, and only the voltage of the restore node La will be lowered from a value of Vcc to that of one half Vcc through the sense amplifier to in synchronization with the rising edge of the equalization clock signal Qeq.

According to the present invention described above, when a data sensing and restoration are carried out in a CMOS DRAM cell, the peak current can be reduced, and the operating power can be kept to a minimum, thereby providing a power-saving and reliable sense amplifier driver for the memory device.

What is claimed is:

1. A sense amplifier driver for a memory device including a sensing clock driver for driving, by means of a multistep sloped sensing enable signal, a sense transistor coupled to a low potential terminal of a sense amplifier for sensing data stored in memory cells, comprising:
    a first inverter for inverting sensing clock signals;
    a second inverter for re-inverting output signals of said first inverter, said second inverter having terminals;
    a third inverter including n-channel MOS transistors and time delaying resistances disposed between the gates of said n-channel MOS transistors and in parallel with the terminals of said second inverter so that said n-channel MOS transistors are turned on successively at different times in response to an output signal from said second inverter, said n-channel MOS transistors having drains commonly connected to the low potential terminal of said sense amplifier; and pull-down means for reducing a gate voltage of at least one said n-channel MOS transistor, upon cessation of the sensing enable signal, said pull-down means having delaying characteristics and disposed within said third inverter.

2. The sense amplifier driver as claimed in claim 1, wherein said pull-down means for the gate of said n-channel MOS transistor has delaying characteristics;

said pull-down means being operated in such a manner that, when the sensing enable signal ceases a potential is reduced at the gate of at least one of said n-channel MOS transistors disposed within said third inverter when said pull-down means is activated, so that respective n-channel MOS transistors of said third inverter are simultaneously turned off, thereby preventing the formation of a DC current path between a power source, the sense amplifier, and ground.

* * * * *